(12) United States Patent
Shih et al.

(10) Patent No.: US 9,343,401 B2
(45) Date of Patent: May 17, 2016

(54) SEMICONDUCTOR PACKAGE AND FABRICATION METHOD THEREOF

(71) Applicant: Siliconware Precision Industries Co., Ltd., Taichung (TW)

(72) Inventors: Chi-Liang Shih, Taichung (TW);
Hsin-Lung Chung, Taichung (TW);
Te-Fang Chu, Taichung (TW);
Sheng-Ming Yang, Taichung (TW);
Hung-Cheng Chen, Taichung (TW);
Chia-Yang Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 20 days.

(21) Appl. No.: 14/256,496

(22) Filed: Apr. 18, 2014

(65) Prior Publication Data

US 2015/0243574 A1 Aug. 27, 2015

(30) Foreign Application Priority Data

Feb. 25, 2014 (TW) .............................. 103106214 A

(51) Int. Cl.
*H01L 29/04* (2006.01)
*H01L 29/10* (2006.01)
(Continued)

(52) U.S. Cl.
CPC ...... *H01L 23/49838* (2013.01); *H01L 23/3128* (2013.01); *H01L 24/32* (2013.01); *H01L 24/46* (2013.01); *H01L 24/83* (2013.01); *H01L 24/27* (2013.01); *H01L 24/29* (2013.01); *H01L 24/48* (2013.01); *H01L 24/49* (2013.01); *H01L 24/73* (2013.01); *H01L 24/92* (2013.01); *H01L 2224/27436* (2013.01);
(Continued)

(58) Field of Classification Search
USPC ........... 257/531, 532, 72, 428, 528, 734, 787, 257/685, 686, 723, 726, E25.031–E25.032, 257/E23.042; 438/127, 15, 51, 6, 28, 66, 438/67, 107, 109, 406, 455–459
See application file for complete search history.

(56) References Cited

U.S. PATENT DOCUMENTS

| 2008/0251875 | A1* | 10/2008 | Wu | ......................... H01L 23/16 257/434 |
| 2008/0315372 | A1* | 12/2008 | Kuan | ..................... H01L 21/568 257/659 |
| 2011/0278703 | A1* | 11/2011 | Pagaila | ............... H01L 23/5389 257/659 |

*Primary Examiner* — Dao H Nguyen
*Assistant Examiner* — Tram H. Nguyen
(74) *Attorney, Agent, or Firm* — Mintz Levin Cohn Ferris Glovsky and Popeo, P.C.; Peter F. Corless; Steven M. Jensen

(57) ABSTRACT

A method for fabricating a semiconductor package is provided, which includes the steps of: providing a packaging substrate having a first surface with a plurality of bonding pads and an opposite second surface; disposing a plurality of passive elements on the first surface of the packaging substrate; disposing a semiconductor chip on the passive elements through an adhesive film; electrically connecting the semiconductor chip and the bonding pads through a plurality of bonding wires; and forming an encapsulant on the first surface of the packaging substrate for encapsulating the semiconductor chip, the passive elements and the bonding wires. By disposing the passive elements between the packaging substrate and the semiconductor chip, the invention saves space on the packaging substrate and increases the wiring flexibility. Further, since the bonding wires are not easy to come into contact with the passive elements, the invention prevents a short circuit from occurring.

18 Claims, 3 Drawing Sheets

(51) Int. Cl.
*H01L 31/00* (2006.01)
*H01L 23/498* (2006.01)
*H01L 23/31* (2006.01)
*H01L 23/00* (2006.01)

(52) U.S. Cl.
CPC .......... *H01L 2224/2919* (2013.01); *H01L 2224/32225* (2013.01); *H01L 2224/32268* (2013.01); *H01L 2224/451* (2013.01); *H01L 2224/48227* (2013.01); *H01L 2224/49175* (2013.01); *H01L 2224/73265* (2013.01); *H01L 2224/83191* (2013.01); *H01L 2224/92247* (2013.01); *H01L 2924/00014* (2013.01); *H01L 2924/15311* (2013.01); *H01L 2924/181* (2013.01); *H01L 2924/19103* (2013.01); *H01L 2924/19105* (2013.01)

SEMICONDUCTOR PACKAGE AND FABRICATION METHOD THEREOF

CROSS-REFERENCES TO RELATED APPLICATIONS

This application claims under 35 U.S.C. §119(a) the benefit of Taiwanese Application No. 103106214, filed Feb. 25, 2014, the entire contents of which is incorporated herein by reference.

BACKGROUND OF THE INVENTION

1. Field of the Invention

The present invention relates to semiconductor packages and fabrication methods thereof, and more particularly, to a semiconductor package having passive elements and a fabrication method thereof.

2. Description of Related Art

The development of electronic products having small size and high performance requires IC elements having high memory capacities, high frequencies and low voltages. Further, the development of IC elements having high memory capacities, high frequencies and low voltages depends on the integration degree of electronic circuits and electronic elements of the IC elements and the density of I/O connectors used for signal transmission.

Currently, BGA type semiconductor devices capable of accommodating a large number of passive elements, such as capacitors, resistors, inductors and oscillators, have become a mainstream.

In some semiconductor application devices, such as communication or high-frequency semiconductor devices, semiconductor chips need to be electrically connected to passive elements, such as resistors, inductors, capacitors and oscillators, so as to obtain certain electric current characteristics or send certain signals.

FIG. 1 is a schematic perspective view of a conventional BGA type semiconductor device. Referring to FIG. 1, a plurality of passive elements 11 and a plurality of semiconductor chips 12 are disposed on a surface of a substrate 10. To facilitate electrical connection between the semiconductor chips 12 and bonding fingers (not shown) of the substrate 10, the passive elements 11 are generally positioned at corners of the substrate 10 or outside chip mounting areas of the substrate 10. However, the limited positions of the passive elements 11 reduce the wiring flexibility of the substrate 10 and the limited positions of the boning fingers restrict the number of the passive elements 11 that can be disposed on the substrate 10, thereby hindering the development of highly integrated semiconductor devices. On the other hand, if the surface area of the substrate 10 is increased to accommodate a large number of passive elements 11 and semiconductor chips 12, the size of the final package will be increased. As such, it cannot meet the trend of miniaturization.

Accordingly, another conventional BGA type semiconductor device is provided. Referring to FIG. 2, a plurality of passive elements 22 are disposed between a semiconductor chip 23 and bonding fingers of the substrate. However, as the number of I/O connectors in a unit area of the semiconductor device increases, the number of bonding wires 21 also increases. Generally, the height of the passive elements 22 (e.g. 0.8 mm) is higher than the height of the semiconductor chip 23 (e.g., 0.55 mm). Therefore, to prevent the bonding wires 21 from coming into contact with the passive elements 22, the bonding wires must be positioned high above the passive elements 22, thus increasing the bonding difficulty and processing complexity. Also, wire loops of the bonding wires 21 are increased and consequently the fabrication cost of the bonding wires 21 is increased. Further, the bonding wires 21 at high positions easily sag due to lack of support. As such, the bonding wires 21 easily come into contact with the passive elements 22 and cause a short circuit to occur.

Therefore, how to overcome the above-described drawbacks has become critical.

SUMMARY OF THE INVENTION

In view of the above-described drawbacks, the present invention provides a semiconductor package, which comprises: a packaging substrate having a first surface with a plurality of bonding pads and a second surface opposite to the first surface; a plurality of passive elements disposed on the first surface of the packaging substrate; an adhesive film attached to the passive elements; a semiconductor chip attached to the adhesive film such that the adhesive film is sandwiched between the semiconductor chip and the passive elements; a plurality of bonding wires electrically connecting the semiconductor chip and the bonding pads; and an encapsulant formed on the first surface of the packaging substrate for encapsulating the semiconductor chip, the passive elements and the bonding wires.

In the above-described package, a chip mounting area can be defined on the first surface of the packaging substrate such that the passive elements are positioned inside the chip mounting area and the bonding pads are positioned outside the chip mounting area.

The above-described package can further comprise a plurality of conductive elements formed on the second surface of the packaging substrate.

In the above-described package, the conductive elements can be solder balls.

In the above-described package, each of the passive elements can be a capacitor, a resistor, an inductor or an oscillator.

The present invention further provides a method for fabricating a semiconductor package, which comprises the steps of: providing a packaging substrate having a first surface with a plurality of bonding pads and a second surface opposite to the first surface; disposing a plurality of passive elements on the first surface of the packaging substrate; disposing an adhesive film and a semiconductor chip on the passive elements in a manner that the adhesive film is sandwiched between the semiconductor chip and the passive elements; electrically connecting the semiconductor chip and the bonding pads through a plurality of bonding wires; and forming an encapsulant on the first surface of the packaging substrate for encapsulating the semiconductor chip, the passive elements and the bonding wires.

In the above-described method, disposing the adhesive film and the semiconductor chip on the passive elements comprises preparing the semiconductor chip having the adhesive film thereon and then disposing the semiconductor chip having the adhesive film on the passive elements. Therein, preparing the semiconductor chip having the adhesive film thereon can comprise: attaching an adhesive film to a surface of a semiconductor wafer having a plurality of semiconductor chips; and performing a singulation process.

In the above-described method, the first surface of the packaging substrate can have a chip mounting area defined thereon such that the passive elements are positioned inside the chip mounting area and the bonding pads are positioned outside the chip mounting area.

After forming the encapsulant, the method can further comprise forming a plurality of conductive elements on the second surface of the packaging substrate. The conductive elements can be solder balls.

Each of the passive elements can be a capacitor, a resistor, an inductor or an oscillator.

Therefore, by disposing the passive elements between the packaging substrate and the semiconductor chip, the present invention saves space on the packaging substrate and increases the wiring flexibility. Further, since the bonding wires are not easy to come into contact with the passive elements, the present invention prevents a short circuit from occurring, thereby increasing the product yield and reliability.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "on", "a" etc. are merely for illustrative purposes and should not be construed to limit the scope of the present invention.

Figure 1:
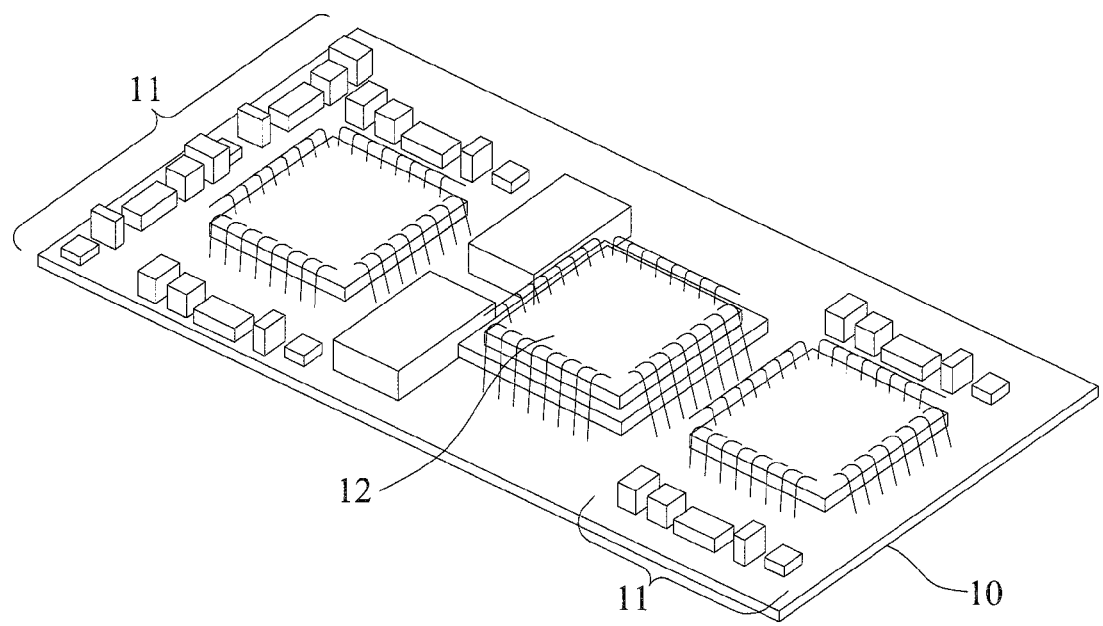
FIG. 1 is a schematic perspective view of a conventional BGA type semiconductor device.
Figure 2:
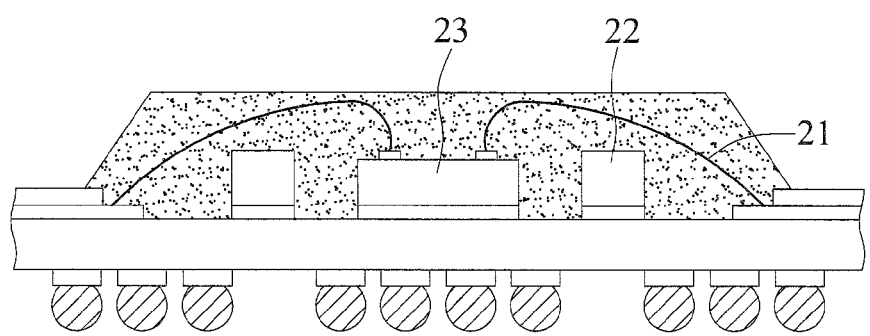
FIG. 2 is a schematic cross-sectional view of another conventional BGA type semiconductor device.
Figure 3A:
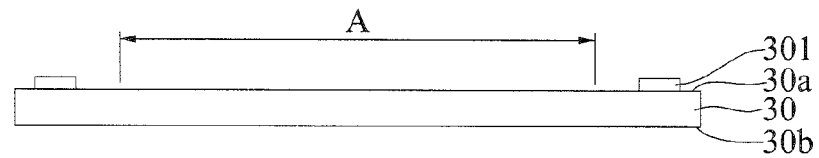
FIGS. 3A to 3F' are schematic cross-sectional views showing a method for fabricating a semiconductor package according to the present invention, wherein FIG. 3F' shows another embodiment of FIG. 3F.
Figure 3B:
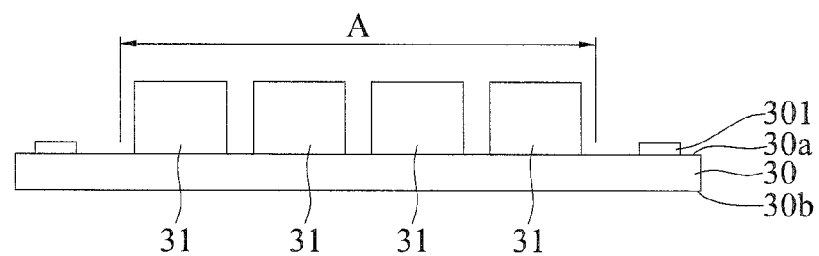
Figure 3C:
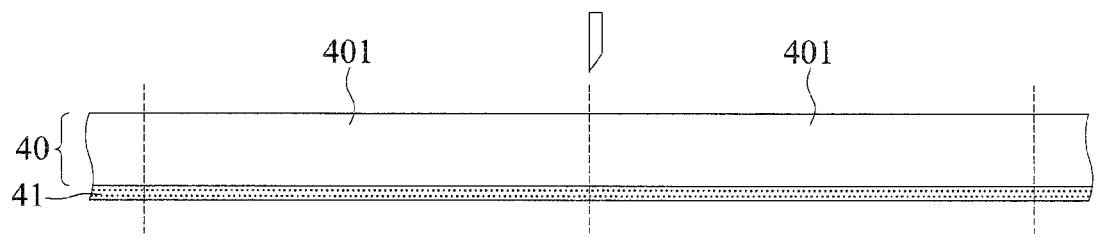
Figure 3D:
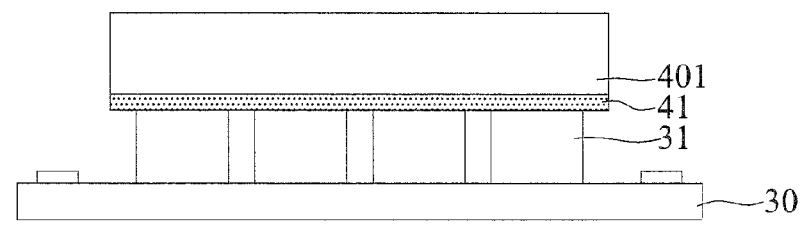
Figure 3E:
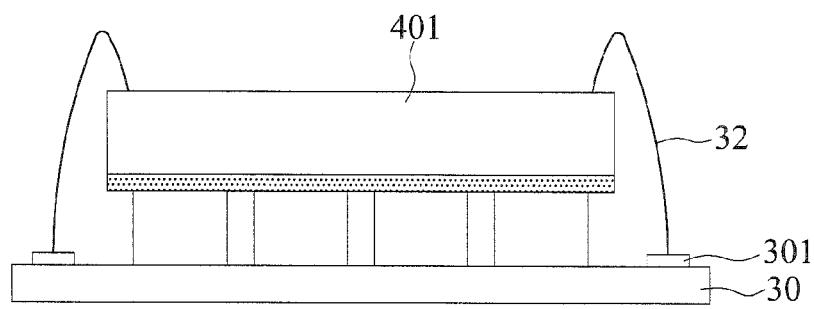
Figure 3F:
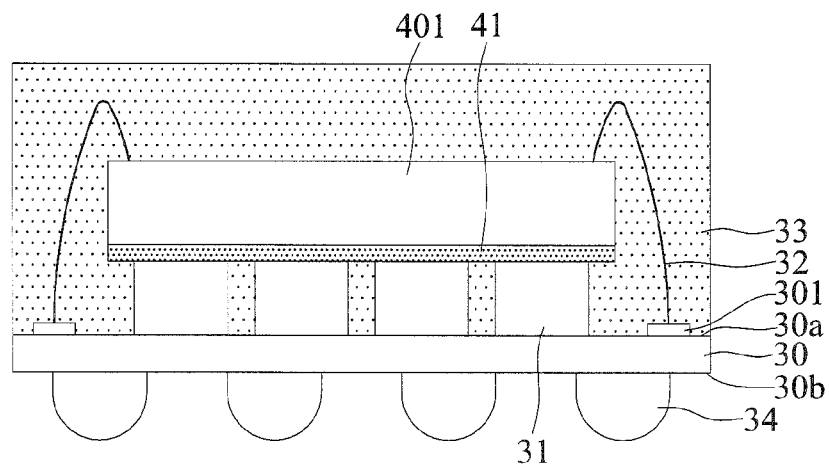
Figure 3F:
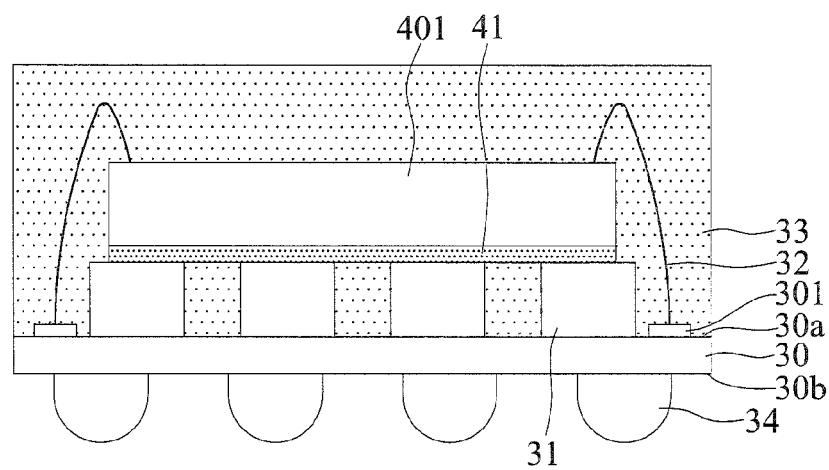

FIGS. 3A to 3F' are schematic cross-sectional views showing a method for fabricating a semiconductor package according to the present invention, wherein FIG. 3F' shows another embodiment of FIG. 3F.

Referring to FIG. 3A, a packaging substrate 30 having a first surface 30a and a second surface 30b opposite to the first surface 30a is provided. A chip mounting area A is defined on the first surface 30a of the packaging substrate 30 and a plurality of bonding pads 301 are formed around an outer periphery of the chip mounting area A.

Referring to FIG. 3B, a plurality of passive elements 31 are disposed inside the chip mounting area A on the first surface 30a of the packaging substrate 30. Each of the passive elements 31 can be a capacitor, a resistor, an inductor or an oscillator.

Referring to FIG. 3C, an adhesive film 41 is attached to a surface of a semiconductor wafer 40 having a plurality of semiconductor chips 401. Then, a singulation process is performed to obtain a plurality of singulated semiconductor chips 401 having the adhesive film 41 thereon.

Referring to FIG. 3D, at least one of the singulated semiconductor chips 401 having the adhesive film 41 thereon is disposed on the passive elements 31 in a manner that the adhesive film 41 is sandwiched between the semiconductor chip 401 and the passive elements 31.

Referring to FIG. 3E, a plurality of bonding wires 32 are formed to electrically connect the semiconductor chip 401 and the bonding pads 301.

Referring to FIG. 3F, an encapsulant 33 is formed on the first surface 30a of the packaging substrate 30 for encapsulating the semiconductor chip 401, the passive elements 31 and the bonding wires 32. Further, a plurality of conductive elements 34 are formed on the second surface 30b of the packaging substrate 30. The conductive elements 34 can be, for example, solder balls.

In the above-described embodiment, the passive elements 31 are positioned within a projection area of the semiconductor chip 401 on the packaging substrate 30. In another embodiment, referring to FIG. 3F', the passive elements 31 can extend outside the projection area of the semiconductor chip 401 on the packaging substrate 30.

The present invention further provides a semiconductor package, which has: a packaging substrate 30 having a first surface 30a with a plurality of bonding pads 301 and a second surface 30b opposite to the first surface 30a; a plurality of passive elements 31 disposed on the first surface 30a of the packaging substrate 30; an adhesive film 41 attached to the passive elements 31; a semiconductor chip 401 attached to the adhesive film 41 such that the adhesive film 41 is sandwiched between the semiconductor chip 401 and the passive elements 31; a plurality of bonding wires 32 electrically connecting the semiconductor chip 401 and the bonding pads 301; and an encapsulant 33 formed on the first surface 30a of the packaging substrate 30 for encapsulating the semiconductor chip 401, the passive elements 31 and the bonding wires 32.

In the above-described package, a chip mounting area A can be defined on the first surface 30a of the packaging substrate 30 such that the passive elements 31 are positioned inside the chip mounting area A and the bonding pads 301 are positioned outside the chip mounting area A. The package can further have a plurality of conductive elements 34 formed on the second surface 30b of the packaging substrate 30.

The conductive elements 34 can be solder balls. Each of the passive elements 31 can be a capacitor, a resistor, an inductor or an oscillator.

Therefore, by disposing the passive elements between the packaging substrate and the semiconductor chip, the present invention saves space on the packaging substrate and increases the wiring flexibility. Further, since the bonding wires are not easy to come into contact with the passive elements, the present invention prevents a short circuit from occurring, thereby increasing the product yield and reliability.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   a packaging substrate having a first surface with a plurality of bonding pads and a second surface opposite to the first surface;
   a plurality of passive elements disposed on the first surface of the packaging substrate;
   an adhesive film attached to the passive elements, wherein the adhesive film does not contact the first surface of the packaging substrate;
   a semiconductor chip directly attached to the adhesive film such that the adhesive film is sandwiched between the semiconductor chip and the passive elements;
   a plurality of bonding wires electrically connecting the semiconductor chip and the bonding pads; and an encapsulant formed on the first surface of the packaging substrate for encapsulating the semiconductor chip, the passive elements and the bonding wires.

2. The package of claim 1, wherein a chip mounting area is defined on the first surface of the packaging substrate such that the passive elements are positioned inside the chip mounting area and the bonding pads are positioned outside the chip mounting area.

3. The package of claim 1, wherein each of the passive elements is a capacitor, a resistor, an inductor or an oscillator.

4. The package of claim 1, wherein the adhesive film is disposed between the semiconductor chip and top surfaces of the plurality of passive elements.

5. The package of claim 1, wherein the encapsulant is a single layer.

6. The package of claim 1, wherein the adhesive film is attached on the bottom surface of the semiconductor chip.

7. The package of claim 1, wherein top surfaces of the plurality of passive elements are in contact with the adhesive film, and sidewalls of the plurality of passive elements are in contact with the encapsulant.

8. The package of claim 1, wherein the encapsulant is a single layer and in direct contact with the first surface of the packaging substrate.

9. A method for fabricating a semiconductor package, comprising the steps of:
   providing a packaging substrate having a first surface with a plurality of bonding pads and a second surface opposite to the first surface;
   disposing a plurality of passive elements on the first surface of the packaging substrate;
   disposing an adhesive film and a semiconductor chip on the passive elements in a manner that the semiconductor chip is directly attached to the adhesive film, and the adhesive film is sandwiched between the semiconductor chip and the passive elements, wherein the adhesive film does not contact the first surface of the packaging substrate;
   electrically connecting the semiconductor chip and the bonding pads through a plurality of bonding wires; and
   forming an encapsulant on the first surface of the packaging substrate for encapsulating the semiconductor chip, the passive elements and the bonding wires.

10. The method of claim 9, wherein the first surface of the packaging substrate has a chip mounting area defined thereon such that the passive elements are positioned inside the chip mounting area and the bonding pads are positioned outside the chip mounting area.

11. The method of claim 9, wherein disposing the adhesive film and the semiconductor chip on the passive elements comprises preparing the semiconductor chip having the adhesive film thereon and then disposing the semiconductor chip having the adhesive film on the passive elements.

12. The method of claim 11, wherein preparing the semiconductor chip having the adhesive film thereon comprises:
   attaching an adhesive film to a surface of a semiconductor wafer having a plurality of semiconductor chips; and
   performing a singulation process.

13. The method of claim 9, wherein each of the passive elements is a capacitor, a resistor, an inductor or an oscillator.

14. The package of claim 9, wherein the adhesive film is disposed between the semiconductor chip and top surfaces of the plurality of passive elements.

15. The package of claim 9, wherein the encapsulant is a single layer.

16. The package of claim 9, wherein the adhesive film is attached on the semiconductor chip.

17. The package of claim 9, wherein top surfaces of the plurality of passive elements are in contact with the adhesive film, and sidewalls of the plurality of passive elements are in contact with the encapsulant.

18. The package of claim 9, wherein the encapsulant is a single layer and in direct contact with the first surface of the packaging substrate.

* * * * *